United States Patent [19]

Lee

[11] Patent Number: 4,982,115

[45] Date of Patent: Jan. 1, 1991

[54] DIGITAL SIGNAL DIRECTION DETECTION CIRCUIT

[75] Inventor: Waitak P. Lee, Fountain Valley, Calif.

[73] Assignee: Rockwell International Corporation, El Segundo, Calif.

[21] Appl. No.: 305,344

[22] Filed: Feb. 2, 1989

[51] Int. Cl.$^5$ .................... H03K 19/175; H03K 3/284
[52] U.S. Cl. ................................ 307/475; 307/272.1; 307/355
[58] Field of Search ..................... 307/514, 517, 272.1, 307/272.2, 272.3, 355, 475, 236, 247.1, 242, 241

[56] References Cited

U.S. PATENT DOCUMENTS

| | | |
|---|---|---|
| 1,191,152 | 7/1916 | Bullard . |
| 3,317,668 | 5/1967 | Johnsen .................................. 178/69 |
| 3,769,525 | 10/1973 | Foss et al. ............................ 307/456 |
| 3,832,703 | 8/1974 | Lenert et al. ......................... 178/69 |
| 4,154,978 | 5/1979 | Tu ......................................... 307/242 |
| 4,390,990 | 6/1983 | Ainsworth ............................ 371/57 |
| 4,419,592 | 12/1983 | Norgren et al. ..................... 307/456 |
| 4,624,006 | 11/1986 | Rempfer et al. ..................... 307/242 |
| 4,680,491 | 7/1987 | Yokouchi et al. ................... 307/242 |
| 4,713,557 | 12/1987 | Carter .................................. 307/475 |
| 4,714,802 | 12/1987 | Stein ..................................... 333/119 |
| 4,774,422 | 9/1988 | Donaldson et al. ................. 307/475 |
| 4,835,418 | 5/1989 | Hsich .................................... 307/475 |

*Primary Examiner*—Timothy P. Callahan
*Attorney, Agent, or Firm*—H. Fredrick Hamann; George A. Montanye; David J. Arthur

[57] ABSTRACT

A digital circuit includes two digital signal sources, each having an output terminal connected to corresponding bus portions. Logic connects the two bus portions for propagating a signal pulse on one of the bus portions onto the other of the bus portion, and produces a digital indication signal signifying which of the signal sources generated the signal pulse. The logic includes logic gates, each having a first input connected to its corresponding bus portion, an output terminal connected to the indicator output, and a second input terminal connected to the output terminal of the opposite logic gate. The output of each logic gate also controls the connection of the other bus portion to a voltage source to bring that bus portion to the active state in response to the other bus portion being rendered active by its associated signal source.

11 Claims, 3 Drawing Sheets

DIGITAL SIGNAL DIRECTION DETECTION CIRCUIT

BACKGROUND OF THE INVENTION

In various digital electronic systems, different signals may share a common bus. For example, an interrupt signal may appear on the bus in a microcomputer system, and various serial clocks may appear in a serial communication system. In the implementation of such digital systems, it may be important to know the source from which the signal is pulled active. This determination may also need to be made without interfering with the propagation of the signal on the bus line.

In the past, certain analog schemes have been implemented for detecting which signal source is originating the signal. But, use of an analog signal direction detecting circuit requires that the analog circuit be included in with the digital circuitry, which is likely to complicate manufacturing.

Certain digital schemes have been used in bus arbitration mechanisms to determine which of many users is requesting access to a bus, but without the ability to propagate the signal.

The art has lacked a simple digital circuit for both detecting which signal source is transmitting a digital signal onto a bus and propagating that signal on to another signal source device.

SUMMARY OF THE INVENTION

The present invention includes first and second digital signal sources, each having an output terminal. A first bus portion is connected to the output terminal of the first signal source, and a second bus portion is connected to the output terminal of the second signal source. Digital logic connecting the first and second bus portions propagates a signal pulse on one of the bus portions onto the other of the bus portions, and produces an indication signal signifying which of the signal sources generated the signal pulse.

The logic is implemented by two logic gates, each having two input terminals and an output terminal. Each bus portion is connected to an input terminal of the corresponding one of the logic gates. The output terminals of the logic gates are connected to indicator output terminals for propagating first and second indication signals when the first and second signal sources, respectively, are generating a signal pulse.

DETAILED DESCRIPTION OF THE PREFERRED EMBODIMENTS

Figure 1:
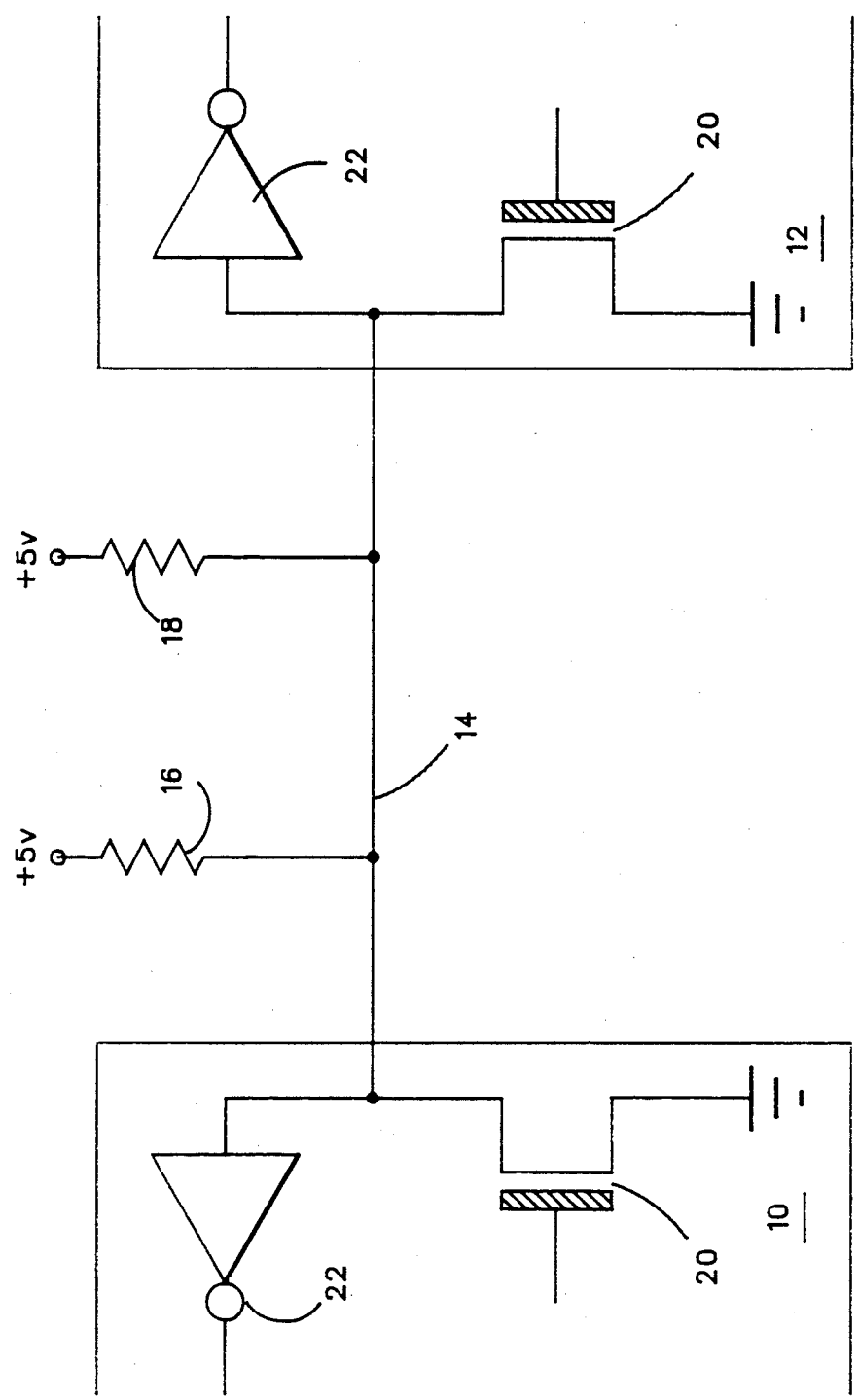
FIG. 1 illustrates a pair of digital signal sources connected by a bus.

FIG. 1 illustrates two digital signal sources 10, 12 connected together by a bus 14. The illustrated arrangement is for a circuit in which the bus is active low. In such a circuit the voltage on the bus is normally held high (+5V) through the pull-up resistors 16, 18 connected to a high voltage source. The bus is pulled low (to ground potential) when one or the other of the signal sources becomes active. The output circuitry shown in the digital signal sources 10, 12 is exemplary only of a typical signal source output stage. In the illustrated output stage the output terminal voltage is selectively pulled low through an output FET switch 20. Received signals are inverted and amplified in an inverting amplifier 22.

Figure 2:
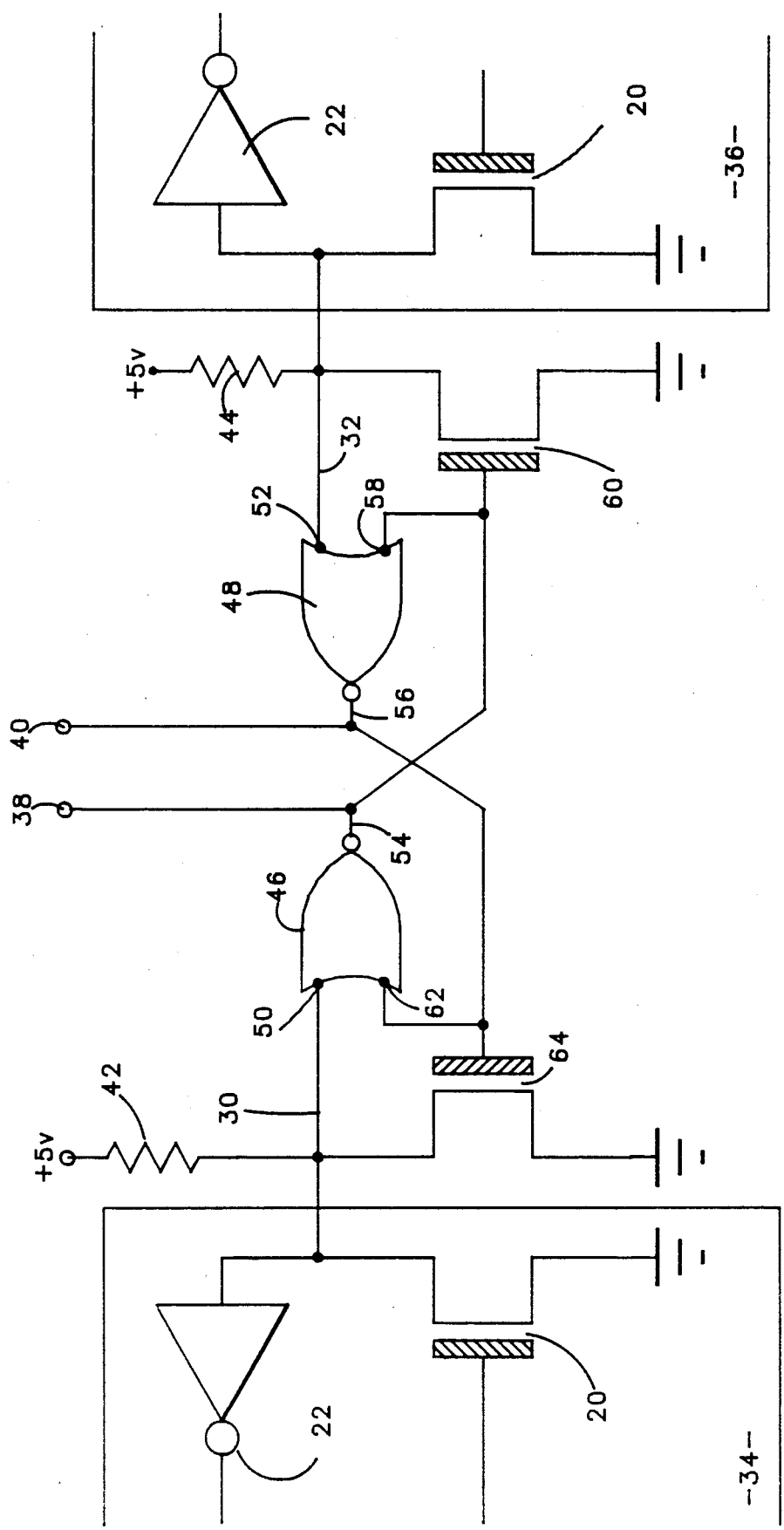
FIG. 2 illustrates a pair of digital signal sources connected with a bus and one embodiment of a digital signal detection circuit constructed according to the invention.

The circuit shown in FIG. 2 includes signal direction detection circuitry according to the invention that can be inserted in the bus without disrupting the propagation of signals on the bus. The circuit has two signal input terminals and bus portions 30, 32, each connected to the output terminal of the corresponding signal sources 34, 36, and two output signal terminals 38, 40 to indicate which of the two signal sources pulls the bus signal active. The inactive signal state on the bus portions 30, 32 is high. Each bus portion is connected to a high voltage (+5V) source through a pull-up resistor 42, 44 to hold the bus voltage high when neither signal source is active.

Logic connected between the bus portions generates indication signals on the output signal terminals signifying which signal source has placed an active signal on its corresponding bus portion. The logic includes two logic gates 46, 48, each having a first input terminal 50, 52 connected to the corresponding bus portion. The output terminal 54, 56 of each logic gate is connected to the corresponding output signal terminal 38, 40.

As the configuration illustrated in FIG. 2 is for signal sources in which the active state is low, the logic gates are NOR gates. The output of each NOR gate is high only when both inputs are low. Otherwise the NOR gate output is low.

The output terminal 54 of the first NOR gate is connected to the second input terminal 58 of the second NOR gate, and also controls a FET switch 60 connecting the second bus portion 32 to a low voltage source, such as ground potential. This connection allows an active signal to be propagated from the first bus portion 30 to the second bus portion 32. Similarly, the output terminal 56 of the second NOR gate is connected to the second input terminal 62 of the first NOR gate and controls a FET switch 64 connecting the first bus portion 30 to ground potential to allow propagation of a signal from the second bus portion to the first bus portion. In the illustrated embodiment the FET switches 60, 64 are enhancement mode field effect transistors so that a high voltage on the gate turns the FET on.

In the inactive state, when both signal sources 34, 36 are off, the signals from the signal sources are high on both bus portions 30, 32. Thus, the voltage on the output terminals of both NOR gates will be low and the voltage on the output indicator terminals 38, 40 will also be low, indicating that both signal sources are off.

When the first signal source 34 drives the first bus portion low, both inputs to the first NOR gate 46 are then low, so that the output terminal of the NOR gate goes high. This results in a high signal on the first indicator output terminal 38, indicating that the first signal source 34 is active. The connection between the output terminal 54 of the first NOR gate and the gate of the FET switch 60 turns on the FET, pulling the voltage on the second bus portion 32 low, to propagate the signal from the first bus portion to the second bus portion, and thus to the second signal source. The output terminal of the first NOR gate is also connected to the second input 58 of the second NOR gate so that the voltage on the second input is now high, meaning that as the voltage on the second bus portion is pulled low, the output terminal 56 on the second NOR gate remains low; thus, the second output terminal 40 remains low, and no indication is produced on the second indicator terminal 40 that the second signal source 36 is active.

When the first signal source 34 ceases to pull the first bus portion low, causing the high voltage source to pull the first bus portion high through the pull-up resistor 42, the output terminal 54 of the first NOR gate again goes low, turning off the FET switch 60, and allowing the voltage on the second bus portion 32 to be pulled up by the high voltage source through the pull-up resistor 44.

As can be seen from the symmetry of the circuitry, if the second signal source 36 is rendered active, pulling the second bus portion 32 low, the logic produces a high signal on the second indicator output terminal 40 and propagates the active low signal on through the circuitry to the first bus portion 30 and to the first signal source 34.

In certain circumstances, there may be a possibility of race condition developing involving the transitions of the voltages of the input terminals to the NOR gates. If such a problem is perceived, NOR gates having a third input terminal can be substituted for the illustrated NOR gates. The third input terminal to each NOR gate is an active low clock. The clock causes the other two input terminals to be polled periodically to avoid transients producing false results at the output terminal of the NOR gate.

Figure 3:
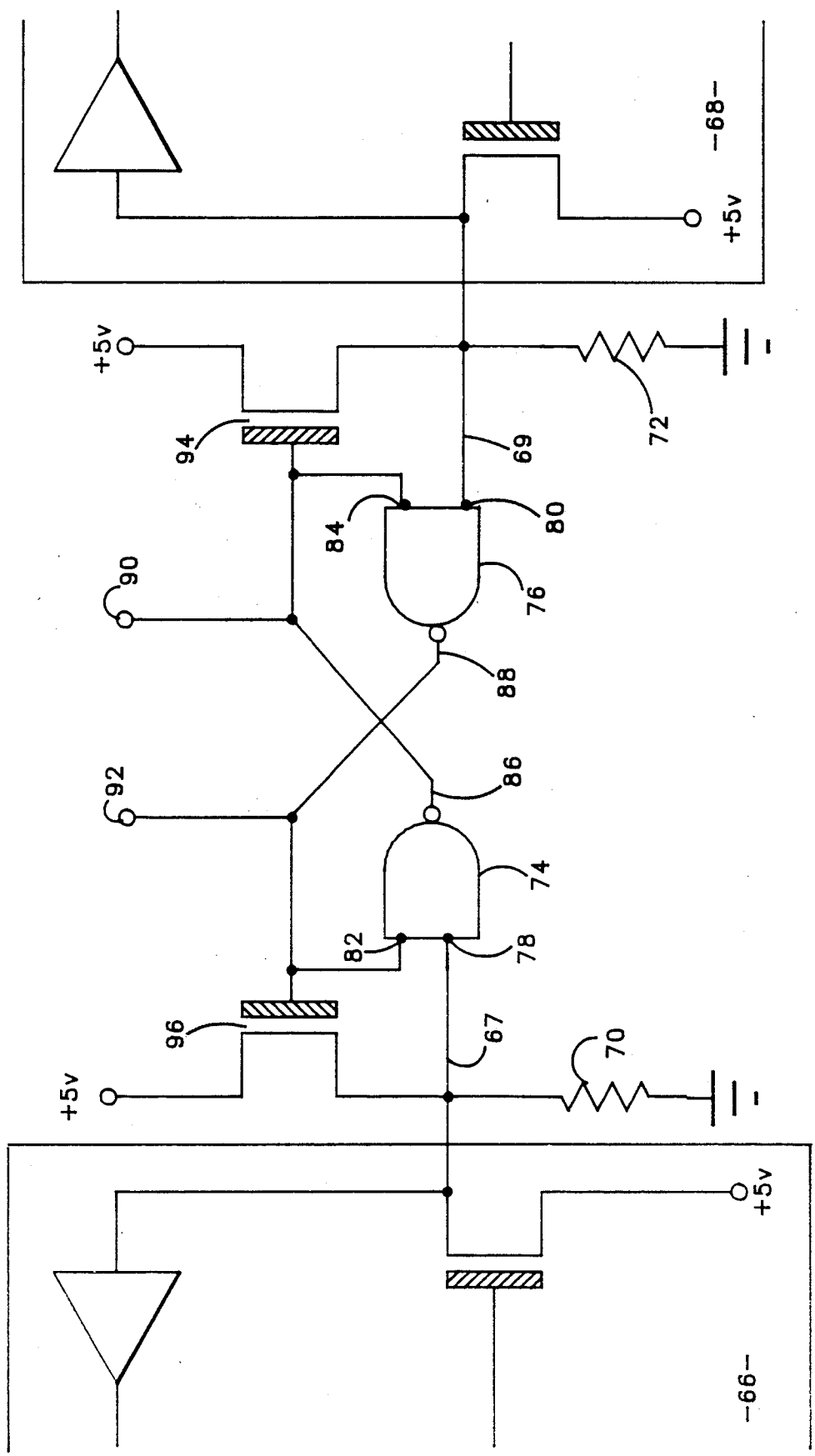
FIG. 3 illustrates two digital signal sources connected by a bus and a second embodiment of a digital direction detection circuit constructing according to the invention.

FIG. 3 illustrates an embodiment of the invention in which the bus connecting the two signal sources 66, 68 is active high.

The two bus portions 67, 69 are kept normally low by connecting the bus portions to ground through pull-down resistors 70, 72. The logic gates of the signal direction detection circuit are NAND gates 74, 76. The output of each NAND gate 74, 76 is high except when both inputs are high.

The first input 78, 80 of each NAND gate is connected to the corresponding bus portion. The second input 82, 84 to each NAND gate is connected to the output terminal 86, 88 of the opposite NAND gate. A first indicator output terminal 90 is also connected to the output terminal 86 of the first NAND gate 74, and a second indicator output terminal 92 is connected to the output terminal 88 of the second NAND gate 76.

In its quiescent state, when both signal sources are inactive, the two signal bus portions are kept low. In this state, the outputs of the NAND gates are both high.

When the first signal source 66 goes active, pulling the voltage on the first bus portion 67 high, both inputs to the first NAND gate 74 are then high, so that the output of the first NAND gate goes low, producing the low signal on the first indicator output terminal 90, indicating that the first signal source is active.

As the output terminal 86 of the first NAND gate 74 is also connected to the gate of a depletion mode FET switch 94 connecting a high voltage source to the second bus portion 69, the low output from the NAND gate 74 turns on the FET switch 94, connecting the second bus portion 69 to the high voltage source, to pull the voltage on the second bus portion high, propagating the signal from the first bus portion 67 to the second bus portion 69. The output terminal of the first NAND gate 74 is also connected to the second input terminal 84 of the second NAND gate. Thus, the second input to the second NAND gate 76 remains high, so the NAND gate output 88 and thus the second indicator terminal 92 remain high, indicating that the second signal source 68 is not active.

Again, when the second signal source 68 is active, raising the voltage on the second bus portion 69, while the first signal source 66 remains inactive, the output of the second NAND gate 76 goes low, turning on a depletion mode FET switch 96 and connecting the first bus portion 67 to the high voltage source. The low output from the NAND gate 76 also produces the indication on the second indicator terminal 92 that the second signal source 68 is active.

Again, if in a particular environment a race condition is likely to develop during the transition periods, a clock input may be provided to each NAND gate to sample or poll the inputs to the logic gates.

Although the invention has been described in terms of preferred embodiments, those skilled in the art will recognize that certain modifications may be made without departing from the spirit of the invention. Therefore, the above description is not to limit the scope of the invention as defined in the following claims.

I claim:

1. A digital circuit comprising:
   first and second digital signal sources, each having an output terminal;
   a first bus portion connected to the output terminal of said first signal source;
   a second bus portion connected to the output terminal of said second signal source;
   digital logic connecting said first and second bus portions for propagating a signal pulse on one of said bus portions onto the other of said bus portions, and for producing an indication signal signifying which of said signal sources generated the signal pulse, wherein said digital logic comprises:
      a first logic gate having first and second input terminals and an output terminal, wherein said first input terminal is connected to said first bus portion;
      a second logic gate having first and second input terminals and an output terminal, wherein said first input terminal is connected to said second bus portion, said second input terminal is connected to said output terminal of said first logic gate, and said output terminal of said second logic gate is connected to said second input terminal of said first logic gate;
      a first indicator output terminal connected to said output terminal of said first logic gate;
      a second indicator output terminal connected to said output terminal of said second logic gate;
   a first voltage source connected to said first and second bus portions;
   a second voltage source;
   a first switch for selectively connecting said second voltage source to said first bus portion; and
   a second switch for selectively connecting said second voltage source to said second bus portion;
   wherein:
   said output terminal of said first logic gate is connected to said second switch to control said second switch; and
   said output terminal of said second logic gate is connected to said first switch to control said first switch.

2. A digital signal direction detection circuit comprising:
- a first circuit input terminal;
- a second circuit input terminal;
- a first logic gate having a first input terminal, a second input terminal, and an output terminal;
- a second logic gate having a first input terminal, a second input terminal, and an output terminal;

wherein:
- said output terminal of said first logic gate is connected to a first indication line;
- said output terminal of said second logic gate is connected to a second indication line;
- said first input terminal of said first logic gate is connected to said first circuit input terminal, to a first voltage source, and, through a first FET switch, to a second voltage source;
- said first input terminal of said second logic gate is connected to said second circuit input terminal, to said first voltage source, and, through a second FET switch, to said second voltage source;
- said second input terminal of said first logic gate is connected to the gate of said first FET switch and to said output terminal of said second logic gate; and
- said second input terminal of said second logic gate is connected to the gate of said second FET switch and to said output terminal of said first logic gate.

3. The digital signal direction detection circuit of claim 2, wherein:
- said first and second logic gates are NOR gates;
- said first voltage source is at approximately +5 volts;
- said second voltage source is at approximately ground potential; and
- said first and second FET switches are enhancement-mode FETs.

4. The digital signal direction detection circuit of claim 2, wherein:
- said first and second logic gates are NAND gates;
- said first voltage source is at approximately ground potential;
- said second voltage source is at approximately +5 volts; and
- said first and second FET switches are depletion-mode FETs.

5. A digital signal direction detection circuit comprising:
- a first circuit input terminal;
- a second circuit input terminal;
- a first logic gate having a first input terminal connected to said first circuit input terminal, a second input terminal, and an output terminal;
- a second logic gate having a first input terminal connected to said second circuit input terminal, a second input terminal connected to said output terminal of said first logic gate, and an output terminal connected to said second input terminal of said first logic gate;
- a first source of a first electric potential connected to said first and second circuit input terminals;
- a second source of a second electric potential;
- a first switch connected between said second electric potential source and said first circuit input terminal and having a control terminal connected to said output terminal of said second logic gate for selectively connecting said second electric potential source and said first circuit input terminal; and
- a second switch connected between said second electric potential source and said second circuit input terminal and having a control terminal connected to said output terminal of said first logic gate for selectively connecting said second electric potential source and said second circuit input terminal.

6. The circuit of claim 5 wherein:
- said first switch is an FET having its conduction path connected between said second source of electric potential and said first circuit input terminal, and having its gate connected to said output terminal of said second logic gate; and
- said second switch is an FET having its conduction path connected between said second source of electric potential and said second circuit input terminal and having its gate connected to said output terminal of said first logic gate.

7. The circuit of claim 6, wherein:
- said first and second logic gates are NOR gates;
- said first source of electric potential is a source of relatively high electric potential; and
- said second source of electric potential is a source of relatively low electric potential.

8. The circuit of claim 6, wherein:
- said first and second logic gates are NAND gates;
- said first source of electric potential is a source of relatively low electric potential; and
- said second source of electric potential is a source of relatively high electric potential.

9. The circuit of claim 6, wherein:
- said first switch is an FET having its conduction path connected between said second source of electric potential and said first circuit input terminal, and having its gate connected to said output terminal of said second logic gate; and
- said second switch is an FET having its conduction path connected between said second source of electric potential and said second circuit input terminal and having its gate connected to said output terminal of said first logic gate.

10. The circuit of claim 9, wherein:
- said first and second logic gates are NOR gates;
- said first voltage source is a source of relatively high electric potential; and
- said second voltage source is a source of relatively low electric potential.

11. The circuit of claim 9, wherein:
- said first and second logic gates are NAND gates;
- said first voltage source is a source of relatively low electric potential; and
- said second voltage source is a source of relatively high electric potential.

* * * * *